United States Patent [19]

Oura et al.

[11] Patent Number: 6,086,994
[45] Date of Patent: Jul. 11, 2000

[54] HEAT-CONDUCTIVE AND PRESSURE-SENSITIVE ADHESIVE SHEETS AND METHOD FOR FIXING ELECTRONIC PARTS TO HEAT-RADIATING MEMBER USING THE SAME

[75] Inventors: Masahiro Oura; Kazuyuki Kitakura; Shigeki Muta; Takao Yoshikawa, all of Osaka, Japan

[73] Assignee: Nitto Denko Corporation, Osaka, Japan

[21] Appl. No.: 09/061,142

[22] Filed: Apr. 16, 1998

[30] Foreign Application Priority Data

Apr. 17, 1997 [JP] Japan ................................ 9-099883

[51] Int. Cl.⁷ .............................. B32B 7/12; B32B 15/04
[52] U.S. Cl. ................................... 428/345; 428/355 AC; 156/332
[58] Field of Search ........................ 428/345, 355 AC; 156/332

[56] References Cited

U.S. PATENT DOCUMENTS 5,213,868  5/1993  Liberty et al. .
5,298,791  3/1994  Liberty et al. .

FOREIGN PATENT DOCUMENTS 0566093  4/1993  European Pat. Off. .

OTHER PUBLICATIONS

XP-002071516 (corresponds to JPA 61-236882, published Oct. 22, 1986).

XP-002071517 (corresponds to JPA 59-091182, published May 25, 1984).

XP-002071518 (corresponds to JPA 51-119733, published Oct. 20, 1976).

*Primary Examiner*—Christopher Raimund
*Attorney, Agent, or Firm*—Sughrue, Mion, Zinn, Macpeak & Seas, PLLC

[57] ABSTRACT

Heat-conductive and pressure-sensitive adhesive sheets which are excellent in heat resistance, scarcely undergo anchoring fracture between the base material and the adhesive layer and, therefore, are usable in fixing electronic parts to heat-radiating members or fixing members in various fields including constructive materials, vehicles, aircrafts and ships. the heat-conductive and pressure-sensitive adhesive sheets are in the form of sheets, tapes, etc. wherein a layer of a heat-conductive and pressure-sensitive adhesive composition, which contains an alkyl (meth)acrylate polymer having hydrophilic groups, is formed on the high frequency sputter-etched surface(s) of a plastic film containing 2 to 50% by volume of a heat-conductive, electrical insulating filler.

6 Claims, No Drawings

HEAT-CONDUCTIVE AND PRESSURE-SENSITIVE ADHESIVE SHEETS AND METHOD FOR FIXING ELECTRONIC PARTS TO HEAT-RADIATING MEMBER USING THE SAME

FIELD OF THE INVENTION

This invention relates to heat-conductive and pressure-sensitive adhesive sheets in the form of sheets, tapes, etc., which are useful for fixing electronic parts, in particular, fixing an electronic part to a heat-radiating member, and for fixing members in various fields such as building materials, vehicles, aircrafts and ships.

BACKGROUND OF THE INVENTION

With an increase of integration of IC circuits, heat value is increased in electronic parts such as hybrid packages, multimodules, and sealed-type integrated circuits with plastics and metals. Since the increase of temperature due to the increased heat value may cause malfunction of the electronic parts, a countermeasure of preventing the malfunction by attaching a heat-radiating member such as a heat sink to the electronic part has been taken.

As a method for providing electronic parts with heat-radiating members, a method which comprises using an adhesive prepared by adding aluminum powder etc. to a composition comprising a polymerizable acrylate monomer and a free radical initiator is proposed in U.S. Pat. No. 4,722,960. In this method, after the adhesive is applied onto one or both of the electronic part and the heat-radiating member, it is necessary to effect curing treatment using a primer or blocking oxygen. Such an adhesion treatment needs a long time and much labor, and the materials to be adhered have to be fixed temporally until the completion of curing, thereby resulting in poor efficiency in producing the electronic devices.

Further, U.S. Pat. No. 4,606,962 proposes to use an adhesive tape which has an adhesive layer containing silver grains having a diameter exceeding the thickness of the layer. When silver grains are added in the process of the preparation of the adhesive composition, the viscosity of the composition is extremely increased and, as a result, the composition becomes poor in flowability and handling properties, in particular, coating workability. When such a composition is formed into a tape, no thickness accuracy can be achieved, and in the worst case, no tape can be obtained. In addition, there arises another problem that the tape thus obtained is unusable in the case where electrical insulation is needed.

In contrast, there have been proposed some methods which comprise using pressure-sensitive adhesive tapes containing heat-conductive and electrical insulating particles in the adhesive. When inserted between electronic parts to be electrically insulated and heat-radiating members, these adhesive tapes can adhere and fix them utilizing the pressure-sensitive adhesion without showing any trouble in handling properties, etc., which the adhesive tapes containing silver grains cause.

In some of these heat-conductive and pressure-sensitive adhesive tapes, those which do not need any base material are known, for example, as disclosed in JP-A-6-88061 corresponding to EP 566093 A1 (the term "JP-A" as used herein means an "unexamined published Japanese patent application"). However, in order to establish sufficient tape strength for fully adhering and fixing electronic parts to heat-radiating members, a layer of the pressure-sensitive adhesive composition containing heat-conductive and electrical insulating particles is preferably formed on a highly heat-resistant plastic film as the base material.

As the heat-conductive and pressure-sensitive adhesive tape having the above-mentioned constitution and being on market, an acrylic pressure-sensitive adhesive comprising a methyl acrylate/2-ethylhexyl acrylate copolymer as the main component is known. However, tapes of this type suffer from some troubles in heat resistance, frequently undergo anchoring fracture between the base material and the adhesive layer, and are poor in the capability of adhering and fixing electronic parts to heat-radiating members.

On the other hand, as a heat-conductive interfacial material located between a heat source and a radiator, JP-A-5-198709 (U.S. Pat. No. 5,213,868) proposes a heat-conductive material comprising a plastic film (made of nylon, polyesters, polyimides, polyamides, etc.) having a pressure-sensitive acrylic adhesive layer formed thereon and perforated, embossed or grooved so as to remove the air between the heat source and the radiator. However, these materials are also unsatisfactory in heat resistance and fail to achieve any sufficient effects as an interfacial material.

Namely, electrical insulating, heat-conductive and pressure-sensitive adhesive tapes are advantageous in that electronic parts to be insulated can be easily adhered and fixed to heat-radiating members without resort to any troublesome and time-consuming adhesion treatment. However, these tapes are poor in heat resistance and frequently undergo anchoring fracture between the base material and the adhesive layer, as described above. In order to apply these tapes to fixation of electronic parts to heat-radiating members, it is strongly desired to overcome this problem.

Under these circumstances, the present invention aims at providing a heat-conductive and pressure-sensitive adhesive sheet which is excellent in heat resistance, scarcely undergoes anchoring fracture between the base material and the adhesive layer and, therefore, is usable in fixing electronic parts to heat-radiating members or fixing members in various fields including constructive materials, vehicles, aircrafts and ships.

In order to achieve the above-mentioned object, the present inventors have conducted extensive studies and, as a result, have achieved the present invention based on the finding that a heat-conductive and pressure-sensitive adhesive sheet having excellent heat resistance and improved adhesion of the adhesive layer to the base material and scarcely undergoing anchoring fracture between the base material and the adhesive layer can be obtained by using a plastic film having a specific composition, i.e., containing a heat-conductive, electrical insulating filler as the base material, subjecting one or both of the surfaces of the film to high frequency sputter etching, and then forming a heat-conductive and pressure-sensitive adhesive composition having a specific composition, i.e., containing an acrylic polymer having hydrophilic groups, on the sputter-etched surface(s).

SUMMARY OF THE INVENTION

Accordingly, the present invention relates to heat-conductive and pressure-sensitive adhesive sheets in the form of sheets, tapes, etc., wherein a layer composed of a heat-conductive and pressure-sensitive adhesive composition, which contains an alkyl (meth)acrylate polymer having hydrophilic groups, is formed on the high frequency sputter-etched surface(s) of a plastic film (as a base material) containing 2 to 50% by volume of a heat-conductive, electrical insulating filler. Moreover, the present invention relates to a method for fixing an electronic part to a heat-radiating member, wherein the electronic part is adhered and fixed to the heat-radiating member via the heat-conductive and pressure-sensitive adhesive sheet.

DETAILED DESCRIPTION OF THE INVENTION

Examples of the base material which can be used in the present invention include a plastic film made of polyesters, polyimides(amides), etc., which generally has a thickness of 12 μm to 4 mm and contains a heat-conductive, electrical insulating filler. From the viewpoint of heat resistance, it is preferred to use polyimide(amide) films, i.e., polyimide films or polyimide-amide films.

The polyimide(amide) films are made of imide (amide) compounds made from an aromatic dianhydride (pyromellitic dianhydride, etc.) and an aromatic diamine (4,4'-diaminodiphenyl ether, paraphenylenediamine, etc.), and are commercially available as films having excellent heat resistance. Polyimides(amides) excellent in heat resistance are described in detail in U.S. Pat. Nos. 2,149,286, 2,407,896, 2,421,024, 2,502,576 and 2,710,853.

The heat-conductive, electrical insulating filler to be added to the film imparts a high heat-conductivity to the film and contributes to the improvement in the adhesion between the film surface and the adhesive layer via the interaction with the high frequency sputter etching treatment to the film surface. The content of the heat-conductive, electrical insulating filler in the film ranges from 2 to 50% by volume, preferably from 10 to 35% by volume. When the content of the heat-conductive, electrical insulating filler is less than 2% by volume, the effects can be hardly achieved. When the content thereof exceeds 50% by volume, some problems in film strength, etc. are frequently caused.

The plastic film containing the heat-conductive, electrical insulating filler can be prepared, for example, by a method which comprises melting the plastic material for the plastic film, mixing the melt with the heat-conductive, electrical insulating filler, and casting the mixture to form a sheet, or a method which comprises incorporating the heat-conductive, electrical insulating filler into the plastic material and extruding the mixture.

Examples of the heat-conductive, electrical insulating filler include ceramics and metal oxides having electrical insulating properties such as $SiO_2$, $TiB_2$, BN, $Si_3N_4$, $TiO_2$, MgO, NiO, CuO, $Al_2O_3$, $Fe_2O_3$. Among all, it is preferable from the viewpoints of heat-conductivity and availability to use BN or $Al_2O_3$. Such a filler generally has an average particle diameter of from 0.5 to 250 μm, preferably from 1 to 100 μm and still preferably from 2 to 10 μm. These particles may be in any form such as spheres, needles, flakes or stars.

In the present invention, either one or both of the surfaces of the above-mentioned plastic film are subjected to high frequency sputter etching. A layer comprising a specific heat-conductive and pressure-sensitive adhesive composition described later is formed on the treated surface(s) to thereby obtain a heat-conductive and pressure-sensitive adhesive sheet having improved adhesion between the adhesive layer and the base material, scarcely causing anchoring fracture between the adhesive layer and the base material, and being excellent in heat resistance. This is seemingly caused by the interaction between hydrophilic groups, which are formed on the surface(s) of the base material by the above-mentioned treatment, and the adhesive composition.

The high frequency sputter etching may be performed under such conditions that the sputter etching per se can conduct stable and continuous discharge without largely lowering the etching speed. It is preferably performed under an atmospheric pressure of from 0.0005 to 0.5 Torr, still preferably from 0.001 to 0.15 Torr. Although the atmospheric gas may be an arbitrary one, it is preferable to avoid to use a highly active gas (chlorine gas, fluorine gas, etc.) or an organic gas which undergoes discharge polymerization in the step of the sputter etching. In practice, inert gases such as argon, air, nitrogen, steam, carbon dioxide, etc. can be used.

The frequency in the sputter etching is from several hundred KHz to several ten MHz. This treatment is practically carried out at a frequency of 13.56 MHz, which is industrially assigned in Japan. The discharge power is from 0.1 to 5 Watt/$cm^2$. Since the treatment time is prolonged with an decrease in the discharge power, it is recommended to employ a high discharge power so as to complete the treatment within a short period of time. The degree of the treatment on the surface is roughly expressed as the product of the discharge power and the treatment time.

In the present invention, the adhesive composition to be provided on the high frequency sputter-etched surface is a heat-conductive and pressure-sensitive adhesive composition containing an alkyl (meth)acrylate polymer having hydrophilic groups. A typical example thereof is one composed of: a) as the alkyl (meth)acrylate polymer having hydrophilic groups, 100 parts by weight of a copolymer made from a monomer mixture which comprises from 70 to 99% by weight of a primary monomer containing an alkyl (meth)acrylate having 2 to 14, on average, carbon atoms in the alkyl group as the main component, and from 1 to 30% by weight of a secondary monomer, a copolymerizable monomer having a hydrophilic group in its molecule; and b) from 10 to 300 parts by weight of a heat-conductive, electrical insulating filler.

With respect to the primary monomer for the copolymer as component a), an alkyl (meth)acrylate having 2 to 14 carbon atoms on average in the alkyl group is used as the main component. In combination with the main component, other copolymerizable monomers such as styrene, vinyl chloride or vinyl acetate can be used in an amount of 30% by weight or less based on the total amount of the primary monomer which the main component and other copolymerizable monomers constitute.

Examples of the alkyl (meth)acrylate having 2 to 14 carbon atoms on average in the alkyl group include butyl (meth)acrylate, isononyl (meth)acrylate, isooctyl (meth) acrylate and 2-ethylhexyl(meth)acrylate. The primary monomer can be used in an amount of from 70 to 99% by weight, preferably from 90 to 99% by weight based on the monomer mixture. When its content is less than 70% by weight, the adhesion performance of the acrylic polymer is deteriorated.

Examples of the secondary monomer, the copolymerizable monomer having a hydrophilic group in its molecule, to be used together with the primary monomer are those having, as the hydrophilic group, highly polar atomic groups showing strong interaction with water (in other words, "hydrophilic groups") such as $-SO_3H$, $-SO_3M$, $-OSO_3H$, $-OSO_3M$, $-COOM$, $-NR_3X$, $-COOH$, $-NH_2$, $-CN$, $-OH$, $-NHCONH_2$, $-(OCH_2CH_2)_n-$, $-CH_2OCH_3-$, $-OCH_3$, $-COOCH_3$ and $-CS$.

Examples of the copolymerizable monomer as the secondary monomer include acrylic acid, methacrylic acid, maleic acid, caprolactam-modified hydroxyethyl (meth) acrylate, 2-hydroxyethyl acrylate, 2-hydroxypropyl acrylate, 2-hydroxyhexyl acrylate, acrylamide, N-vinylpyrrolidone and acryloyl morpholine. Such a copolymerizable monomer having a hydrophilic group in its molecule can be added in an amount of from 1 to 30% by weight, preferably from 1 to 10% by weight in the monomer mixture. When its content is less than 1% by weight, only a poor effect can be achieved in improving the adhesion to the base material on the basis of the hydrophilic group contained in this monomer. In such a case, there frequently arises a problem in the adhesion/fixation force between an electronic part and a heat-radiating member.

The copolymer as the component a) can be obtained by copolymerizing a monomer mixture comprising the primary monomer and the secondary comonomer by solution polymerization, emulsion polymerization, suspension polymerization, block polymerization, etc. In the production process, use may be optionally made of appropriate polymerization catalysts, for example, heat polymerization initiators, photopolymerization initiators, potassium persulfate, ammonium persulfate, hydrogen peroxide, and redox initiators with the combined use thereof with reducing agents. The copolymer to be used in the present invention generally has a weight-average molecular weight of from several hundred thousands to several millions.

Examples of the heat polymerization initiator include organic peroxides such as benzoyl peroxide, t-butyl perbenzoate, cumene hydroperoxide, diisopropyl peroxydicarbonate, di-n-propyl peroxydicarbonate, di(2-ethoxyethyl) peroxydicarbonate, t-butyl peroxyneodecanoate, t-butyl peroxypivalate, (3,5,5-trimethylhexanoyl) peroxide, dipropionyl peroxide and diacetyl peroxide; and azo compounds such as 2,2'-azobisisobutyronitrile, 2,2'-azobis(2-methylbutyronitrile),1,1'-azobis(cyclohexane-1-carbonitrile), 2,2'-azobis(2,4-dimethylvaleronitrile), 2,2'-azobis(2,4-dimethyl-4-methoxyvaleronitrile), dimethyl 2,2'-azobis(2-methylpropionate), 4,4'-azobis(4-cyanovaleric acid), 2,2'-azobis(2-hydroxymethylpropionitrile) and 2,2'-azobis[2-(2-imidazolin-2-yl)propane].

Examples of the photopolymerization initiator include acetophenone compounds such as 4-(2-hydroxyethoxy) phenyl (2-hydroxy-2-propyl) ketone, α-hydroxy-α,α'-dimethylacetophenone, methoxyacetophenone, 2,2-dimethoxy-2-phenylacetophenone, 2,2-diethoxyacetophenone, 1-hydroxycyclohexyl phenyl ketone and 2-methyl-1-[4-(methylthio)-phenyl]-2-morpholinopropane; benzoin ether compounds such as benzoin ethyl ether, benzoin isopropyl ether and anizoin methyl ether; a-ketol compounds such as 2-methyl-2-hydroxypropiophenone; ketal compounds such as benzyl dimethyl ketal; aromatic sulfonyl chloride compounds such as 2-naphthalene sulfonyl chloride; optically active oxime compounds such as 1-phenone-1,1-propanedione-2-(o-ethoxycarbonyl)oxime; and benzophenone compounds such as benzophenone, benzoylbenzoic acid and 3,3'-dimethyl-4-methoxybenzophenone.

Among the polymerization methods as described above, it is preferable to employ the block polymerization method in which the polymerization is effected with irradiation of radiation such as UV light or electron beams. This polymerization method is free from troubles such as corrosion of electronic parts due to residual organic solvents, swelling, peeling or deviation caused by vaporization and swelling at high temperatures, and contamination, insufficient adhesion or decrease in moisture resistance caused by bleeding of emulsifiers. The molecular weight of the resultant copolymer can be increased by irradiating relatively weak UV light, thereby providing a pressure-sensitive adhesive having a particularly excellent heat resistance while having a high degree of crosslinkage and high cohesive force.

The heat-conductive, electrical insulating filler, i.e., the component b) is used to impart a good heat-conductivity to the pressure-sensitive adhesive composition. Use can be made therefor of the same compounds as the above-mentioned ones employed as the heat-conductive, electrical insulating filler to be incorporated into the base material, namely, $SiO_2$, $TiB_2$, BN, $Si_3N_4$, $TiO_2$, MgO, NiO, CuO, $Al_2O_3$, $Fe_2O_3$, etc. Such a filler generally has an average particle diameter of from 0.5 to 250 $\mu$m, preferably from 1 to 100 $\mu$m and more preferably from 5 to 30 $\mu$m. These particles may be in any form such as spheres, needles, flakes or stars. From the viewpoint of avoiding an increase in the viscosity of the pressure-sensitive adhesive composition, it is preferable that such a filler has a purity of at least 95% by weight, more preferably at least 98% by weight.

It is recommended that the heat-conductive, electrical insulating filler as component b) is used in an amount of from 10 to 300 parts by weight, preferably from 10 to 120 parts by weight, per 100 parts by weight of the copolymer as component a). When the content is less than 10 parts by weight, any pressure-sensitive adhesive having high heat-conductivity can be hardly obtained. When the content exceeds 300 parts by weight, the adhesion is deteriorated, in particular, at high temperatures, thus making the adhesion/fixation force poor.

In addition to the above-mentioned components a) and b), the heat-conductive and pressure-sensitive adhesive composition may contain a surface modifier such as a silane coupling agent to improve the adhesion to the base material. If needed, it may further contain various known additives such as pigments, age resistors and tackifiers. Furthermore, it may be subjected to crosslinking treatment with an external or internal crosslinking agent in order to increase the cohesive force and thereby improve heat resistance of the pressure-sensitive adhesive. The total amount of the components other than components a) and b) is generally from 0 to 100 parts by weight per 100 parts by weight of component a).

Examples of the external crosslinking agent include a polyfunctional isocyanate crosslinking agent such as tolylene diisocyanate, trimethylolpropane tolylene diisocyanate and diphenylmethane triisocyanate; an epoxy crosslinking agent such as polyethylene glycol diglycidyl ether, diglycidyl ether and trimethylolpropane triglycidyl ether; a melamine resin crosslinking agents; a metallic salt crosslinking agent; a metallic chelate crosslinking agent; an amino resin crosslinking agent; and a peroxide crosslinking agent. These crosslinking agents are added after the completion of the synthesis of the copolymer and induce the intermolecular crosslinkage of the copolymer by heating or irradiation, thus increasing the cohesive force of the pressure-sensitive adhesive.

Examples of the internal crosslinking agent include a polyfunctional monomer such as hexanediol di(meth) acrylate, (poly)ethylene glycol di(meth)acrylate, (poly) propylene glycol di(meth)acrylate, neopentyl glycol di(meth)acrylate, pentaerythritol di(meth)acrylate, trimethylolpropane tri(meth)acrylate, pentaerythritol tri(meth) acrylate, dipentaerythritol hexa(meth)acrylate, epoxy (meth) acrylate, polyester (meth)acrylate and urethane (meth) acrylate. These crosslinking agents are added during the synthesis of the copolymer and induce the intermolecular crosslinkage of the copolymer simultaneously with the polymerization to thereby increase the cohesive force of the pressure-sensitive adhesive.

The heat-conductive and pressure-sensitive adhesive sheets of the present invention are in the form of sheets or tapes and composed of the above-mentioned base material, i.e., the plastic film containing the heat-conductive, electrical insulating filler, and a heat-conductive and pressure-sensitive adhesive composition layer formed on the high frequency sputter-etched surface(s) of the base material and usually having a thickness of 10 to 150 μm. In the production of these heat-conductive and pressure-sensitive adhesive sheets, the layer of the heat-conductive and pressure-sensitive adhesive composition may be formed on a releasing liner and then transferred onto the base material. Alternatively, the layer of the heat-conductive and pressure-sensitive adhesive composition may be formed directly on the base material without using any releasing liner. These heat-conductive and pressure-sensitive adhesive sheets are excellent in heat-conductivity and pressure-sensitive adhesion, exhibit good adhesion between the base material and the adhesive layer, scarcely undergo anchoring fracture between the base material and the adhesive layer and exhibit high heat resistance.

To adhere and fix an electronic part to a heat-radiating member by using the heat-conductive and pressure-sensitive adhesive sheet according to the present invention, the heat-conductive and pressure-sensitive adhesive sheet is inserted between the electronic part and the heat-radiating member, followed by contact bonding, thereby making use of the pressure-sensitive adhesion. Thus, the electronic part and the heat-radiating member can be well fixed while achieving a high heat-conductivity and a high adhesion strength even at high temperatures.

The electronic parts to be adhered and fixed are not particularly restricted. Examples thereof include IC tips, hybrid packages, multi-tip modules, power transistors and sealed integrated circuits made of plastics or metals. The present invention can be advantageously applied to the adhesion and fixation of electronic parts with a large heat value, for example, those employed in highly integrated circuits.

The heat-radiating members, i.e., another subject to be adhered and fixed, include heat sinks made of metal plates and sheets and radiators. The thickness of the heat sinks generally ranges from 10 μm to 10 mm, preferably 50 μm to 5 mm and still preferably 100 μm to 3 mm, though the present invention is not restricted thereto. The radiators may have arbitrary structures, for example, those provided with cooling fins.

The heat-conductive and pressure-sensitive adhesive sheets of the present invention may be used not only in adhering and fixing these electronic parts to the heat-radiating members but also in fixing members in various fields including constructive materials, vehicles, aircrafts and ships. It is needless to say that the heat-conductive and pressure-sensitive adhesive sheets can achieve the above-mentioned effects when employed for these purposes.

To further illustrate the present invention in greater detail, the following Examples will be given wherein all parts are by weight.

EXAMPLE 1

In 210 parts of ethyl acetate, 95 parts of 2-ethylhexyl acrylate and 5 parts of acrylic acid were subjected to solution polymerization in the coexistence of 0.4 parts of 2,2-azobisisobutyronitrile while stirring under nitrogen replacement at 60 to 80° C. to obtain a solution (solid content: 30% by weight) of a copolymer having a carboxyl group as a hydrophilic group in its molecule and having a viscosity of about 120 P (poise) and a degree of polymerization of 99.2% by weight. To this solution were added, per 100 parts of the copolymer, 3 parts of a polyfunctional isocyanate crosslinking agent and 60 parts of silica ($SiO_2$; purity 99.8% by weight, average particle diameter 1.8 μm) as a heat-conductive, electrical insulating filler to thereby prepare a heat-conductive and pressure-sensitive adhesive composition.

Separately, high frequency sputter etching was performed on the both surfaces of a base material, which was a polyimide film containing 18% by volume of alumina ($Al_2O_3$; purity 99.7% by weight, average particle diameter 3.7 μm) as a heat-conductive, electrical insulating filler and having a thickness of 28 μm, by applying high frequency voltage of 13.6 MHz under an argon gas atmosphere at 0.005 Torr while regulating the discharge power at 4 Watt/$cm^2$ for 30 seconds.

The heat-conductive and pressure-sensitive adhesive composition prepared above was applied onto the both surfaces (i.e., sputter-etched surfaces) of this base material followed by hot air-drying at 40° C. for 5 minutes and then at 130° C. for additional 5 minutes to obtain a layer of the heat-conductive and pressure-sensitive adhesive composition of 50 μm in thickness on each surface. Thus a heat-conductive and pressure-sensitive adhesive sheet of 128 μm in total thickness was prepared.

Comparative Example 1

A heat-conductive and pressure-sensitive adhesive sheet was prepared in the same manner as in Example 1 except for not performing high frequency sputter etching on the both surfaces of the base material made of a polyimide film containing the heat-conductive, electrical insulating filler ($Al_2O_3$).

Comparative Example 2

A heat-conductive and pressure-sensitive adhesive composition was prepared in the same manner as in Example 1 except for using no acrylic acid in the step of solution polymerization. Namely, a copolymer solution having no hydrophilic group (carboxyl group) in the copolymer molecule was used. By using this heat-conductive and pressure-sensitive adhesive composition, a heat-conductive and pressure-sensitive adhesive sheet was prepared in the same manner as in Example 1.

EXAMPLE 2

A premix comprising 75 parts of isooctyl acrylate, 20 parts of butyl acrylate, 5 parts of acrylic acid and 0.1 part of 2,2-dimethoxy-2-phenylacetone employed as a photopolymerization initiator was partly polymerized by exposing to UV light in a nitrogen atmosphere to obtain a coatable syrup having a viscosity of about 40 P. To 100 parts of this syrup were added 0.2 parts of trimethylolpropane triacrylate employed as a crosslinking agent and 40 parts of boron nitride (BN; purity 99.7% by weight, average particle diameter 8 μm) employed as a heat-conductive, electrical insulating filler followed by mixing to obtain a heat-conductive polymerizable composition.

Next, the heat-conductive polymerizable composition thus obtained was applied onto a releasing liner made of a polyester film which had been surface-treated with a releasing agent. Then, photopolymerization was performed by UV-irradiation with a high pressure mercury lamp at 900 mj/cm² at 5 mW/cm² in a nitrogen gas atmosphere, followed by drying in a hot air circulatory dryer (130° C., 5 minutes), to thereby form a layer of a heat-conductive and pressure-sensitive adhesive having a thickness of 50 μm.

Separately, high frequency sputter etching was performed on the both surfaces of a base material, which was a polyimide film containing 18% by volume of boron nitride (BN; purity 99.7% by weight, average particle diameter 8 μm) as a heat-conductive, electrical insulating filler and having a thickness of 28 μm, by applying high frequency voltage of 13.6 MHz under a steam stream at 0.01 Torr while regulating the discharge power at 2 Watt/cm² for 30 seconds.

The heat-conductive and pressure-sensitive adhesive composition layer (thickness: 50 μm) prepared above was transferred onto the both surfaces (i.e., sputter-etched surfaces) of this base material to thereby obtain a heat-conductive and pressure-sensitive adhesive sheet having a total thickness of 128 μm.

EXAMPLE 3

A premix comprising 75 parts of isooctyl acrylate, 20 parts of butyl acrylate, 5 parts of acrylic acid and 0.1 part of 2,2-dimethoxy-2-phenylacetone employed as a photopolymerization initiator was partly polymerized by exposing to UV light in a nitrogen atmosphere to obtain a coatable syrup having a viscosity of about 40 P. To 100 parts of this syrup were added 0.2 parts of trimethylolpropane triacrylate employed as a crosslinking agent and 40 parts of boron nitride (BN; purity 99.7% by weight, average particle diameter 8 μm) employed as a heat-conductive, electrical insulating filler, followed by mixing, to thereby obtain a heat-conductive polymerizable composition.

Next, the heat-conductive polymerizable composition thus obtained was applied onto a releasing liner made of a polyester film which had been surface-treated with a releasing agent. Then photopolymerization was performed by UV-irradiation with a high pressure mercury lamp at 900 mj/cm² at 5 mW/cm² in a nitrogen gas atmosphere, followed by drying in a hot air circulatory dryer (130° C., 5 minutes), to thereby form a layer of a heat-conductive and pressure-sensitive adhesive having a thickness of 50 μm.

Separately, high frequency sputter etching was performed on the both surfaces of a base material, which was a polyimide film containing 18% by volume of alumina (Al₂O₃; purity 99.7% by weight, average particle diameter 3.7 μm) as a heat-conductive, electrical insulating filler and having a thickness of 28 μm, by applying high frequency voltage of 13.6 MHz under an argon gas atmosphere at 0.005 Torr while regulating the discharge power at 4 Watt/cm² for 30 seconds.

The heat-conductive and pressure-sensitive adhesive composition layer (thickness: 50 μm) prepared above was transferred onto the both surfaces (i.e., sputter-etched surfaces) of this base material to thereby obtain a heat-conductive and pressure-sensitive adhesive sheet of 128 μm in total thickness.

EXAMPLE 4

A premix comprising 70 parts of isooctyl acrylate, 20 parts of butyl acrylate, 10 parts of acryloyl morpholine and 0.1 part of 2,2-dimethoxy-2-phenylacetone employed as a photopolymerization initiator was partly polymerized by exposing to UV light in a nitrogen atmosphere to obtain a coatable syrup having a viscosity of about 4,000 cP. To 100 parts of this syrup were added 0.2 parts of trimethylolpropane triacrylate employed as a crosslinking agent and 100 parts of alumina (Al₂O₃; purity 99.7% by weight, average particle diameter 3.7 μm) employed as a heat-conductive, electrical insulating filler, followed by mixing, to thereby obtain a heat-conductive polymerizable composition.

Next, the heat-conductive polymerizable composition thus obtained was applied onto a releasing liner made of a polyester film which had been surface-treated with a releasing agent. Then, photopolymerization was performed by UV-irradiation with a high pressure mercury lamp at 900 mj/cm² at 5 mW/cm² in a nitrogen gas atmosphere followed by drying in a hot air circulatory dryer (130° C., 5 minutes) to form a layer of a heat-conductive and pressure-sensitive adhesive of 50 μm in thickness.

Separately, high frequency sputter etching was performed on the both surfaces of a base material, which was a polyimide film containing 18% by volume of alumina (Al₂O₃; purity 99.7% by weight, average particle diameter 3.7 μm) as a heat-conductive, electrical insulating filler and having a thickness of 28 μm, by applying high frequency voltage of 13.6 MHz under a steam stream at 0.01 Torr while regulating the discharge power at 4 Watt/cm² for 30 seconds.

The heat-conductive and pressure-sensitive adhesive composition layer (thickness: 50 μm) prepared above was transferred onto the both surfaces (i.e., sputter-etched surfaces) of this base material to obtain a heat-conductive and pressure-sensitive adhesive sheet of 128 μm in total thickness. The heat-conductive and pressure-sensitive adhesive sheets obtained in the above Examples 1 to 4 and Comparative Examples 1 and 2 each were evaluated in terms of retentive force resistant to heat shear and heat resistance according to the following methods. The obtained results are shown in Table below.

Retentive Force Resistant to Heat Shear Test

A heat-conductive and pressure-sensitive adhesive sheet (width: 10 mm) was adhered to one lengthwise end of an aluminum plate (125×25×0.4 mm) to obtain an adhesion area of 20×10 mm. After allowing to stand at 80° C. for 30 minutes, a load (500 g) was applied in the lengthwise direction of the adhered surface at 80° C. and the time required till dropping was measured.

Heat Resistance Test

By using a heat-conductive and pressure-sensitive adhesive sheet, a transistor in a TO-220 package (in terms of a standard of Joint Electron Device Engineering Council) was adhered and fixed under a contact bonding pressure of 2 kg/cm² to a heat sink which had been immersed in water to obtain a constant temperature. Then a definite output was supplied to the transistor and the difference in the transistor temperature (T2) from the temperature of the lower surface of the heat-conductive and pressure-sensitive adhesive sheet (T1) was measured. Next, the heat resistance was calculated in accordance with the following formula.

Heat resistance (°C·cm²/W)=(T2−T1)×A/P

A: transistor area (cm²).

P: electrical power (W) consumed by transistor.

The transistor temperature (T2) was measured by using a thermocouple spot-welded to the metallic base of the transistor package. On the other hand, the temperature of the lower surface of the heat-conductive and pressure-sensitive adhesive sheet (T1) was measured by forming a small hole in the heat sink and inserting a thermocouple thereinto. The thermocouple was placed in the heat sink such that it did not give influence onto the adhered area of the heat-conductive and pressure-sensitive adhesive sheet, with the proviso that the location of the thermocouple was as near as possible to the interface between the heat sink and the adhesive sheet.

TABLE

|  | Retentive Force Resistant to Heat Shear Test | Heat Resistance Test (° C. · cm$^2$/W) |
| --- | --- | --- |
| Example 1 | maintained for 120 min. or more | 7.8 |
| Comparative Example 1 | dropped within 30 min | 7.8 |
| Comparative Example 2 | dropped within 30 min | 7.6 |
| Example 2 | maintained for 120 min. or more | 3.8 |
| Example 3 | maintained for 120 min. or more | 4.6 |
| Example 4 | maintained for 120 min. or more | 4.2 |

It can be seen from the results in the above Table that heat-conductive and pressure-sensitive adhesive sheets of Examples 1 to 4 according to the present invention each were not only maintained for not less than 120 minutes in the retentive force resistant to heat shear test but also achieved satisfactory results in the heat resistance test. In contrast, the heat-conductive and pressure-sensitive adhesive sheets of Comparative Examples 1 and 2 dropped within 30 minutes in the retentive force resistant to heat shear test due to anchoring fracture between the base material and the adhesive layer.

As described above, the present invention provides heat-conductive and pressure-sensitive adhesive sheets, wherein a layer of a heat-conductive and pressure-sensitive adhesive composition having a specific composition, which contains an alkyl (meth)acrylate polymer having hydrophilic groups, is formed on the high frequency sputter-etched surface(s) of a plastic film containing a heat-conductive, electrical insulating filler, which are excellent in heat resistance and the adhesion between the base material and the adhesive layer, scarcely undergo anchoring fracture between the base material and the adhesive layer and thus are widely usable in fixing electronic parts, especially, electronic parts to heat-radiating members, or fixing members in various fields including constructive materials, vehicles, aircrafts and ships.

While the invention has been described in detail and with reference to specific embodiments thereof, it will be apparent to one skilled in the art that various changes and modifications can be made therein without departing from the spirit and scope thereof.

What is claimed is:

1. A heat-conductive and pressure-sensitive adhesive sheet which comprises:

a plastic film containing 2 to 50% by volume of a heat-conductive, electrical insulating filler and having at least one surface subjected to a high frequency sputter-etching, and a layer of a heat-conductive and pressure-sensitive adhesive composition formed on the high frequency sputter-etched surface(s), wherein the heat-conductive and pressure-sensitive adhesive composition comprises an alkyl (meth)acrylate polymer having hydrophilic groups.

2. The heat-conductive and pressure-sensitive adhesive sheet of claim 1, wherein said plastic film is a polyimide (amide) film.

3. The heat-conductive and pressure-sensitive adhesive sheet of claim 1, wherein said heat-conductive, electrical insulating filler is BN or $Al_2O_3$.

4. The heat-conductive and pressure-sensitive adhesive sheet of claim 1, wherein said high frequency sputter-etched surface is one having been high frequency sputter-etched under pressure of 0.0005 to 0.5 Torr.

5. The heat-conductive and pressure-sensitive adhesive sheet of claim 1, wherein said heat-conductive and pressure-sensitive adhesive composition comprises: a) as said alkyl (meth)acrylate polymer having hydrophilic groups, 100 parts by weight of a copolymer made from a monomer mixture which comprises from 70 to 99% by weight of a monomer containing an alkyl (meth)acrylate having 2 to 14, on average, carbon atoms in the alkyl group as the main component, and from 1 to 30% by weight of a copolymerizable monomer having a hydrophilic group in its molecule; and b) from 10 to 300 parts by weight of a heat-conductive, electrical insulating filler.

6. A method for fixing electronic parts to heat-radiating members wherein the electronic parts are adhered and fixed to the heat-radiating members via a heat-conductive and pressure-sensitive adhesive sheet which comprises:

a plastic film containing 2 to 50% by volume of a heat-conductive, electrical insulating filler and having at least one surface subjected to a high frequency sputter-etching, and a layer of a heat-conductive and pressure-sensitive adhesive composition formed on the high frequency sputter-etched surface(s), wherein the heat-conductive and pressure-sensitive adhesive composition comprises an alkyl (meth)acrylate polymer having hydrophilic groups.

* * * * *